(12) United States Patent
Cho

(10) Patent No.: US 7,834,674 B2
(45) Date of Patent: Nov. 16, 2010

(54) DELAY CIRCUIT AND DELAY LOCKED LOOP CIRCUIT INCLUDING THE SAME

(75) Inventor: Kwang-Jun Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 5 days.

(21) Appl. No.: 12/344,731

(22) Filed: Dec. 29, 2008

(65) Prior Publication Data

US 2010/0090735 A1 Apr. 15, 2010

(30) Foreign Application Priority Data

Oct. 14, 2008 (KR) .................. 10-2008-0100727

(51) Int. Cl.
*H03H 11/26* (2006.01)
(52) U.S. Cl. .................. 327/276; 327/270; 327/149; 327/150
(58) Field of Classification Search .................. 327/144, 327/146–150, 152–159, 161, 172–176, 31, 327/35–36, 276–278, 269–272
See application file for complete search history.

(56) References Cited

U.S. PATENT DOCUMENTS 6,009,134 A * 12/1999 Yoon .......................... 375/376

7,161,397 B2 * 1/2007 Lee et al. .................. 327/149
2008/0164920 A1 7/2008 Cho
2008/0309387 A1 * 12/2008 Yamane .................. 327/161

FOREIGN PATENT DOCUMENTS

| JP | 11-284496 | 10/1999 |
|---|---|---|
| KR | 1020060112011 | 10/2006 |
| KR | 100837822 B1 | 6/2008 |

OTHER PUBLICATIONS

Notice of Preliminary Rejection issued from Korean Intellectual Property Office on Mar. 22, 2010.
Notice of Allowance issued from Korean Intellectual Property Office on Sep. 16, 2010.

* cited by examiner

*Primary Examiner*—An T Luu
(74) *Attorney, Agent, or Firm*—IP & T Group LLP

(57) ABSTRACT

A delay circuit includes a delay line unit including a plurality of delay units configured to generate a plurality of delay input clocks by delaying an input clock by a unit delay amount in response to at least one delay control signal; and a signal selection unit configured to selectively output at least one of the plurality of delay input clocks in response to the delay control signal.

24 Claims, 10 Drawing Sheets

DELAY CIRCUIT AND DELAY LOCKED LOOP CIRCUIT INCLUDING THE SAME

CROSS-REFERENCE TO RELATED APPLICATIONS

The present invention claims priority of Korean patent application number 10-2008-0100727, filed on Oct. 14, 2008, which is incorporated by reference in its entirety.

BACKGROUND OF THE INVENTION

The present invention relates to a delay circuit and a delay locked loop (DLL) circuit including the same, and more particularly, to a delay circuit with reduced layout area and power consumption, and a DLL circuit including the same.

FIG. 1 is a block diagram of a conventional DLL circuit including a duty cycle ratio correction circuit.

As shown, the conventional DLL circuit includes a first delay lock circuit 101, a second delay lock circuit 131, and a duty cycle ratio correction circuit 151.

The first delay lock circuit 101 includes a first phase comparison unit 103, a first delay control unit 105, a first coarse delay unit 107, a first fine delay unit 109, and a first replica model unit 111. The second delay lock unit 131 includes a second phase comparison unit 133, a second delay control unit 135, a second coarse delay unit 137, a second fine delay unit 139, and a second replica model unit 141. The duty cycle ratio correction circuit 151 includes a duty cycle ratio correction unit 153 and a duty cycle ratio detection unit 155.

The first phase comparison unit 103 compares a phase of a first feedback clock FB_1 outputted from the first replica model unit 111 with a phase of an external clock EXT_CLK to thereby generate a first comparison signal CMP_1. The first comparison signal CMP1 contains information about a phase difference between the external clock EXT_CLK and the first feedback clock FB_1. The first replica model unit 111, which is a circuit for modeling a clock delay factor in a semiconductor device, receives a first internal clock OUT_1 of which a duty cycle ratio is corrected by the duty cycle ratio correction unit 153, and then outputs the first feedback clock FB_1. The first comparison signal CMP_1 generated by the first phase comparison unit 103 is inputted to the first delay control unit 105. To match the phases of the external clock EXT_CLK and the first feedback clock FB_1, the first delay control unit 105 generates a first coarse delay control signal DLC_1 and a first fine delay control signal DLF_1 in response to the first comparison signal CMP_1.

The first coarse delay unit 107 delays the external clock EXT_CLK by a coarse delay amount COARSE_DD (delay amount corresponding to two delay units in FIG. 3) to output one of a first coarse delay clock CLKDC_1 and a second coarse delay clock CLKDC_2 in response to the first coarse delay control signal DLC_1. Herein, the first coarse delay unit 107 delays the external clock EXT_CLK such that a time delay between the first and second coarse delay clocks CLKDC_1 and CLKDC_2 is half the coarse delay amount COARSE_DD, i.e., a unit delay amount UNIT_DD (delay amount corresponding to one delay unit in FIG. 3). A difference in delay amount between the first and second coarse delay clocks CLKDC_1 and CLKDC_2 is finely controlled at the first fine delay unit 109.

The first fine delay unit 109 mixes phases of the first and second coarse delay clocks CLKDC_1 and CLKDC_2 in response to the first fine delay control signal DLF_1 so that the external clock EXT_CLK is delayed by a fine delay amount FINE_DD smaller than the unit delay amount UNIT_DD. The first fine delay unit 109 outputs a first delay-locked internal clock CLK_1.

The second delay lock circuit 131 also performs a similar operation to that of the first delay lock circuit 101, and thus matches phase of the external clock EXT_CLK and a second feedback clock FB_2 to output a second delay-locked internal clock CLK_2. However, since the second fine delay lock unit 139 inverts and outputs the external clock EXT_CLK for the duty cycle ratio correction operation to be described later, rising edges of the first and second delay-locked internal clock internal clocks CLK_1 and CLK_2 are in-phase, and a duty cycle ratio of the second delay-locked internal clock CLK_2 is opposite to that of the first delay-locked internal clock CLK_1. The symbol of circlet given to an output terminal of the second fine delay unit 139 in FIG. 1 means 'inversion'.

The first and second delay-locked internal clocks CLK_1 and CLK_2 are inputted to the duty cycle ratio correction circuit 151. The duty cycle ratio detection unit 155 detects duty cycle ratios of the first and second delay-locked internal clocks CLK_1 and CLK_2 to output a correction signal CTRL_1 corresponding to the duty cycle ratios of the first and second delay-locked internal clocks CLK_1 and CLK_2 to the duty cycle ratio correction unit 153. Since the rising edges of the first and second delay-locked internal clocks CLK_1 and CLK_2 are in-phase with each other, the duty cycle ratio correction unit 153 mixes phases of falling edge of the first and second delay-locked internal clocks CLK_1 and CLK_2 in response to the correction signal CTRL_1, thereby outputting the first and second internal clocks OUT_1 and OUT_2 of which duty cycle ratios are corrected.

FIG. 2 is a block diagram illustrating another conventional DLL circuit including a duty cycle ratio correction circuit.

As shown, the conventional DLL circuit includes a first delay lock circuit 201, a second delay lock circuit 231, and a duty cycle ratio correction circuit 251.

The first delay lock circuit 201 includes a phase comparison unit 203, a first delay control unit 205, a first coarse delay unit 207, a first fine delay unit 209, and a replica model unit 211. The second delay lock circuit 231 includes a second delay control unit 233, a second coarse delay unit 235, and a second fine delay unit 237. The duty cycle ratio correction circuit 251 includes a duty cycle ratio correction unit 253 and a duty cycle ratio detection unit 255.

The first delay lock circuit 201 is similar in operation and configuration to the first delay lock circuit 101 of FIG. 1. However, unlike the second delay lock circuit 131 in FIG. 1, the second delay lock circuit 231 does not include a phase comparison unit and a replica model unit. Instead, the second delay lock circuit 231 delays an external clock EXT_CLK to generate a second delay-locked internal clock CLK_2 in response to a comparison signal CMP and a correction signal CTRL_2 generated by the duty cycle ratio detection unit 255. This allows the duty cycle ratio correction circuit 251 to correct duty cycle ratios of the first and second delay-locked internal clocks CLK_1 and CLK_2.

Since the second delay control unit 233 generates a second coarse delay control signal DLC_2 and a second fine delay control signal DLF_2 in response to the comparison signal CMP, a delay amount of the first delay-locked internal clock CLK_1 is equal to that of the second delay-locked internal clock CLK_2. However, the second fine delay unit 237 inverts and outputs an input signal through its output terminal so that the second delay-locked internal clock CLK_2 is an inverted clock of the first delay-locked internal clock CLK_1

As described above, the second delay control unit 233 generates the second coarse delay control signal DLC_2 and the second fine delay control signal DLF_2 in response to the correction signal CTRL_2. The way the second delay control unit 233 generates the second coarse delay control signal DLC_2 and the second fine delay control signal DLF_2 in response to the correction signal CTRL_2 will be described later together with a correction operation of the duty cycle ratio correction circuit 251.

The duty cycle ratio correction unit 253 generates a correction clock CLK_OUT having a logic high level section corresponding to an interval between a rising edge of the first delay-locked internal clock CLK_1 and a rising edge of the second delay-locked internal clock CLK_2, thereby correcting duty cycle ratios of the first and second delay-locked internal clocks CLK_1 and CLK_2. For example, when a logic high level section of the first delay-locked internal clock CLK_1 is narrower than its logic low level section, a logic high level section of the second delay-locked internal clock CLK_2 is wider than its logic low level section because the second delay-locked internal clock CLK_2 is the inverted clock of the first delay-locked internal clock CLK_1. The rising edge of the first delay-locked internal clock CLK_1 is in-phase with the falling edge of the second delay-locked internal clock CLK_2, and the falling edge of the first delay-locked internal clock CLK_1 is in-phase with the rising edge of the second delay-locked internal clock CLK_2. In this case, therefore, the duty cycle ratio correction unit 253 generates the correction clock CLK_OUT having a logic high level section narrower than a logic low level section.

The duty cycle ratio detection unit 255 detects a duty cycle ratio of the correction clock CLK_OUT to output the correction signal CTRL_2 corresponding to the duty cycle ratio of the correction clock CLK_OUT to the second delay control unit 233.

The second delay control unit 233 activates the second coarse delay control signal DLC_2 and the second fine delay control signal DLF_2 in response to the correction signal CTRL_2 to further delay the second delay-locked internal clock CLK_2. Resultantly, the rising edge of the second delay-locked internal clock CLK_2 is delayed more than the falling edge of the first delay-locked internal clock CLK_1, a logic high level section of the correction clock CLK_OUT is broadened, and finally the duty cycle ratio of the correction clock CLK_OUT approaches to 50:50.

FIG. 3 illustrates the first coarse delay unit 107 and the first fine delay unit 109 shown in FIG. 1.

The first coarse delay unit 107 and the first fine delay unit 109 in FIG. 1 are similar in configuration to the second coarse delay unit 137 and the second fine delay unit 139 in FIG. 1, the first and second coarse delay units 207 and 235 in FIG. 2, and the first and second fine delay units 209 and 237 in FIG. 2. Thus, description will be hereinafter made on the first coarse delay unit 107 and the first fine delay unit 109 shown in FIG. 1.

The first coarse delay unit 107 includes a first delay line 301 and a second delay line 302, each including a plurality of delay units that are enabled in response to the first coarse delay control signal DLC_1. To perform a rapid delay operation, the first coarse delay unit 107 delays the external clock EXT_CLK by the coarse delay amount COARSE_DD larger than the fine delay amount FINE_DD.

The first delay line 301 outputs the first coarse delay clock CLKDC_1 in response to the first coarse delay control signal DLC_1, and the second delay line 302 outputs the second coarse delay clock CLKDC_2 in response to the first coarse delay control signal DLC_1. The first coarse delay control signal DLC_1 is activated in pairs such that a difference in delay time between the first and second coarse delay clocks CLKDC_1 and CLKDC_2 corresponds to the unit delay amount UNIT_DD.

For instance, when the first coarse delay control signal DLC_1<3> and the first coarse delay control signal DLC_1<2> are activated, the external clock EXT_CLK is inputted to the delay units 303 and 309 and delayed while passing through delay units 303, 305, 307, 309 and 311 so that the first coarse delay clocks CLKDC_1 and the second coarse delay clocks CLKDC_2 are outputted. The first coarse delay clock CLKDC_1 is further delayed by the unit delay amount UNIT_DD in comparison with the second coarse delay clock CLKDC_2.

In the first fine delay unit 109, the external clock EXT_CLK is finely delayed by the fine delay amount FINE_DD. The first fine delay unit 109 mixes phases of the first and second coarse delay clocks CLKDC_1 and CLKDC_2 by driving the first and second coarse delay clocks CLKDC_1 and CLKDC_2 with different drive abilities to thereby output the first delay-locked internal clock CLK_1 in response to the first fine delay control signal DLF_1.

The delay line configured with a plurality of delay units in the conventional DLL circuit requires a very large occupation area, and the enabled delay units continue to consume power because the clock is continuously toggling. Moreover, if a delay amount of an output signal of the delay line increases, number of the enabled delay units increases, causing the delay line to consume very large amount of power. However, each of the DLL circuits in FIGS. 1 and 2 includes two coarse delay units of which each is provided with two delay lines. That is, since the conventional DLL circuit includes at least four delay lines necessitating a very large occupation area and consume very large amount of power, the conventional DLL circuit is problematic in that its layout area increases and much power is unnecessarily consumed.

SUMMARY OF THE INVENTION

Embodiments of the present invention are directed to provide a delay circuit and a delay locked loop (DLL) circuit including the same, which can reduce layout area and power consumption.

In accordance with an aspect of the present invention, there is provided a delay circuit including: a delay line unit including a plurality of delay units configured to generate a plurality of delay input clocks by delaying an input clock by a unit delay amount in response to at least one delay control signal; and a signal selection unit configured to selectively output at least one of the plurality of delay input clocks in response to the delay control signal.

In accordance with another aspect of the present invention, there is provided a DLL circuit, including: a shared coarse delay circuit configured to delay an external clock by a coarse delay amount to output first to fourth coarse delay clocks in response to first and second coarse delay control signals; a first delay lock circuit configured to mix phases of the first and second coarse delay clocks to output a first internal clock in response to a first fine delay control signal; a second delay lock circuit configured to mix phases of the third and fourth coarse delay clocks to output a second internal clock in response to a second fine delay control signal; and a duty cycle ratio correction circuit configured to correct duty cycle ratios of the first and second internal clocks.

In accordance with still another aspect of the present invention, there is provided a DLL circuit, including: a shared coarse delay circuit configured to delay an external clock by a coarse delay amount to output first to fourth coarse delay clocks in response to a phase comparison result and a duty cycle ratio detection result; a first delay lock circuit configured to mix phases of the first and second coarse delay clocks to output a first internal clock in response to the phase comparison result of the external clock and a feedback clock in which a delay modeling of the external clock is reflected or applied); a second delay lock circuit configured to mix phases of the third and fourth coarse delay clocks to output a second internal clock in response to the phase comparison result and the duty cycle ratio detection result; and a duty cycle ratio correction circuit configured to generate a correction signal as the duty cycle ratio detection result of the first and second internal clocks, and correct duty cycle ratios of the first and second internal clocks.

DESCRIPTION OF SPECIFIC EMBODIMENTS

Other objects and advantages of the present invention can be understood by the following description, and become apparent with reference to the embodiments of the present invention.

Figure 4:
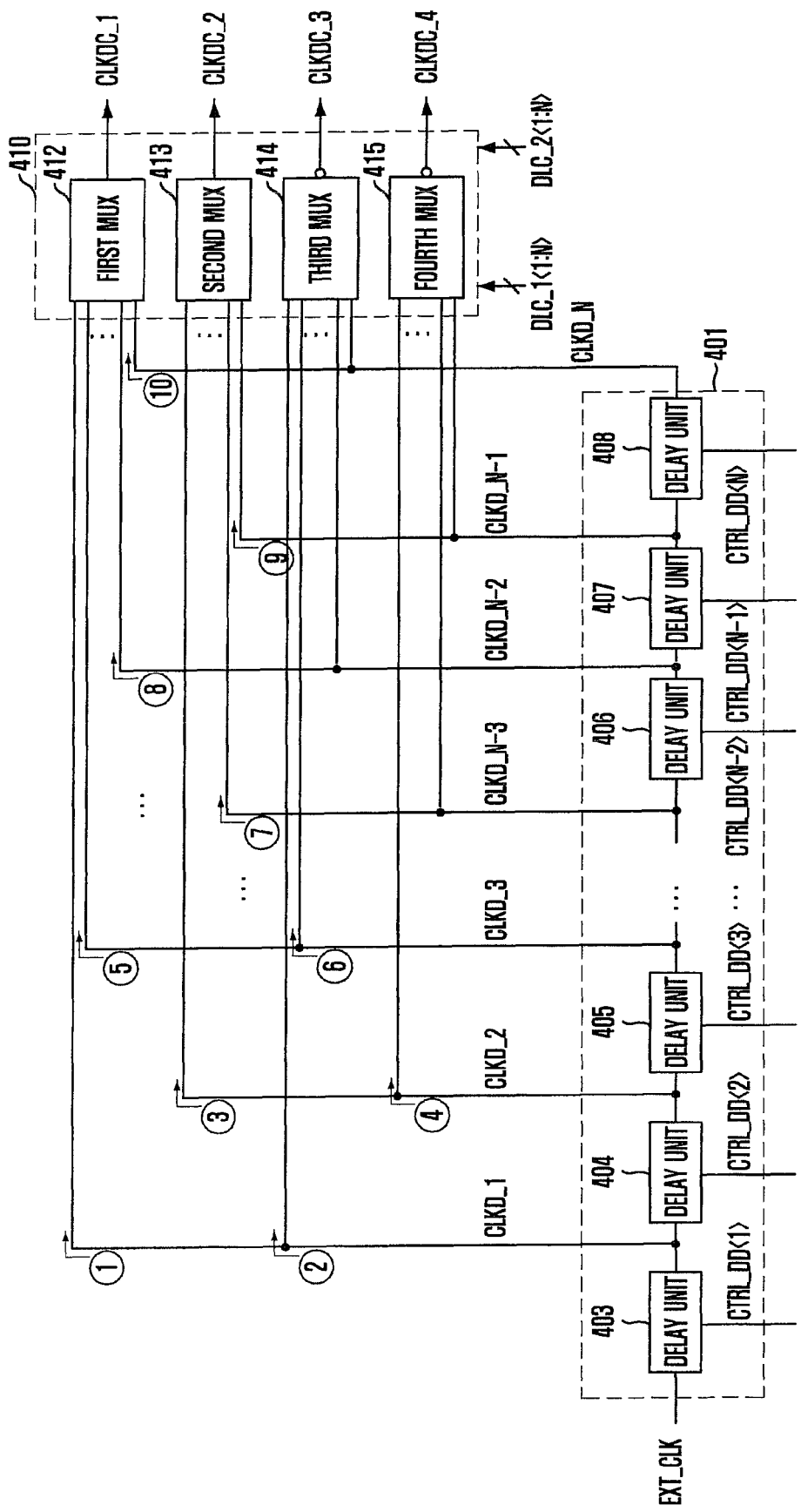
FIG. 4 is a block diagram of a delay circuit in accordance with an embodiment of the present invention.

FIG. 4 is a block diagram of a delay circuit in accordance with an embodiment of the present invention.

As shown, a delay circuit in accordance with the present invention includes a delay line unit 401 and a signal selection unit 410.

The delay circuit of the present invention includes only a single delay line unit 401 where a plurality of delay units 403 to 408 are connected to each other in series. Each of the plurality delay units 403 to 408 is turned on/off in response to a corresponding one of a plurality delay control signals CTRL_DD<1:N> that are an N-bit binary code.

An external clock EXT_CLK is delayed by a unit delay amount UNIT_DD through each of the delay units 403 to 408 in succession. As a result, the delay line unit 401 generates delay input clocks CLKD_1 to CLKD_N that are respectively delayed by various delay amounts. The signal selection unit 410 is responsive to first and second coarse delay control signals DLC_1<1:N> and DLC_2<1:N> to selectively output a plurality of coarse delay clocks CLKDC_1 to CLKDC_4 based on the plurality delay input clocks CLKD_1 to CLKD_N that are respectively delayed by various delay amounts through the delay line unit 401. Therefore, the delay circuit in accordance with the present invention can generate the plurality of coarse delay clocks CLKDC_1 to CLKDC_4 using the single delay line unit 401.

Figure 5:
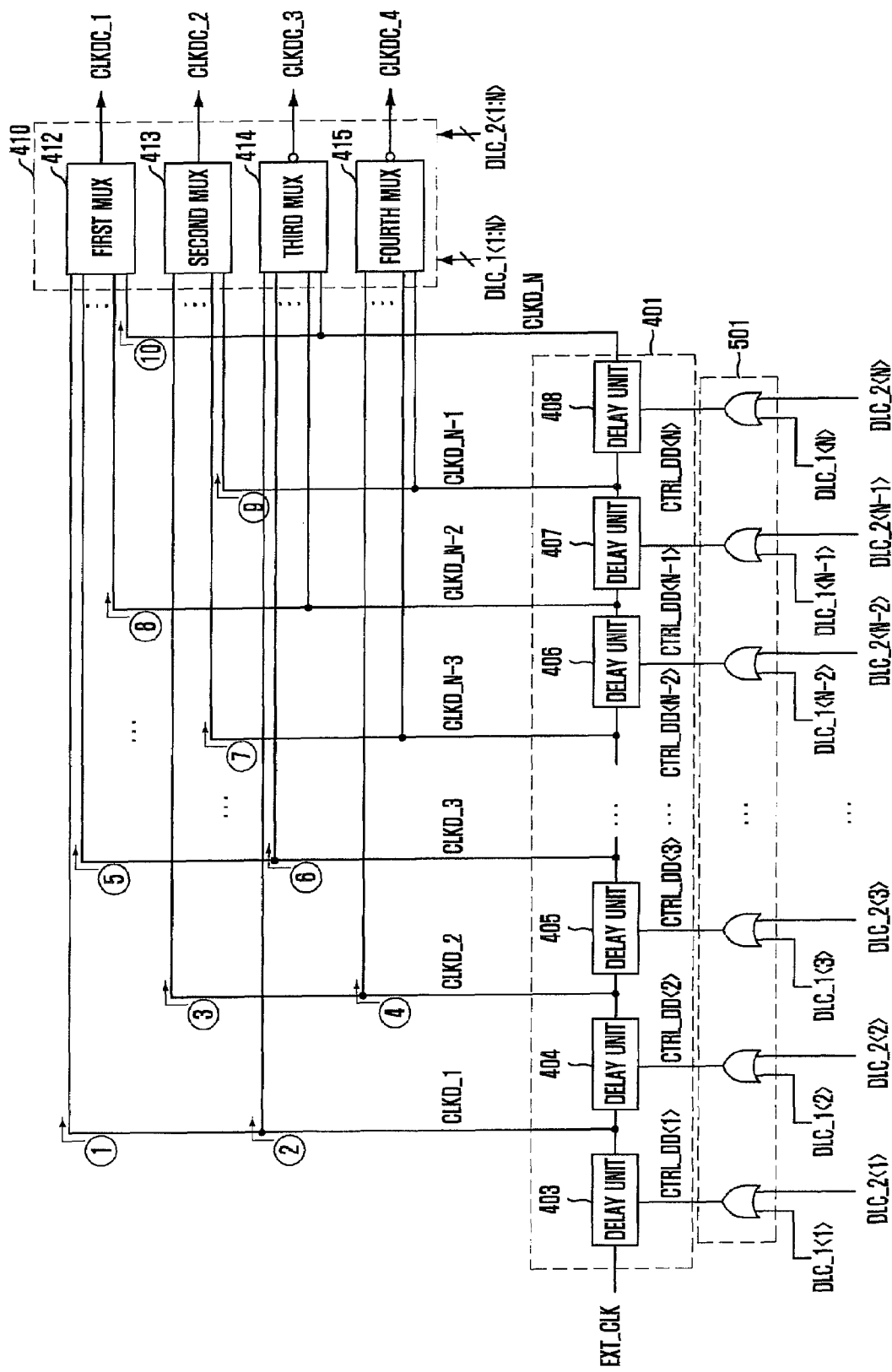
FIG. 5 is a block diagram of a delay circuit in accordance with another embodiment of the present invention.

The delay circuit in accordance with another embodiment of the present invention may further include an input unit 501 as illustrated in FIG. 5.

The input unit 501 includes a plurality of OR gates that performs a logic OR operation on the first and second coarse delay control signals DLC_1<1:N> and DLC_2<1:N> to transfer the resultant signal to the delay line unit 401. The delay control signals CTRL_DD<1:N> are activated when any one of the first and second coarse delay control signals DLC_1<1:N> and DLC_2<1:N> is activated. Accordingly, the delay line unit 401 can generate the delay input clocks CLKD_1 to CLKD_N corresponding to the activated first and second coarse delay control signals DLC_1<1:N> and DLC_2<1:N>. Thereafter, the signal selection unit 410 selects some of the delay input clocks to output the selected signals in response to the activated delay control signal.

To facilitate the understanding, following description will be made on a case that the delay circuit of FIG. 5 in accordance with the present invention is used as a coarse delay unit of a delay locked loop circuit. At this time, a delay control unit may include a thermometer type shift register to generate the first and second coarse delay control signals DLC_1<1:N> and DLC_2<1:N>. The thermometer type shift register is well-known to a person of ordinary skill in the art, and thus an output signal of the thermometer type shift register, e.g., the first and second coarse delay control signals DLC_1<1:N> and DLC_2<1:N> may be activated such that each bit sequentially has a logic high level in a shifting manner, for example, '0001, '0011', and '0111'.

Logic values of the first and second coarse delay control signals DLC_1<1:N> and DLC_2<1:N> respectively differ depending on phase comparison results of first and second phase comparison units. Since the input unit 501 includes the plurality of OR gates receiving the first and second coarse delay control signals DLC_1<1:N> and DLC_2<1:N>, the delay line unit 401 can generate the delay input clocks corresponding to the activated coarse delay control signal when any one of the first and second coarse delay control signals DLC_1<1:N> and DLC_2<1:N> is activated.

The delay line unit 401 includes the plurality of delay units 403 to 408 connected in series, and the plurality of delay units 403 to 408 are activated in response to the first and second coarse delay control signals DLC_1<1:N> and DLC_2<1:N>. The enabled delay unit delays the external clock EXT_CLK or an output signal of the immediately preceding delay unit, and then outputs the delay input clocks CLKD_1 to CLKD_N.

A transfer line connecting the delay line unit 401 to the signal selection unit 410 distributes and transfers the delay input clocks CLKD_1 to CLKD_N outputted from the plurality of delay units 403 to 408 to first to fourth multiplexers 412 to 415. In accordance with this embodiment of the present invention, the delay input clocks CLKD_1 to CLKD_N should be distributed to the first to fourth multiplexers 412 to 415 outputting the plurality of coarse delay clocks CLKDC_1 to CLKDC_4 because only the single delay line unit 401 is used for the plurality of coarse delay clocks CLKDC_1 to CLKDC_4 respectively used in first and second delay lock units (801 and 831 in FIG. 8, and 901 and 931 in FIG. 9) to be described hereinafter.

For example, FIG. 5 illustrates one exemplary case that the delay input clocks outputted from the delay units 403, 405, 406 and 408 of the plurality of delay units 403 to 408 are distributed to the first and third multiplexers 412 and 414 outputting the first and third coarse delay clocks CLKDC_1 and CLKDC_3, and the delay input clocks outputted from the delay units 404 and 407 of the plurality of delay units 403 to 408 are distributed to the second and fourth multiplexers 413 and 415 outputting the second and fourth coarse delay clocks CLKDC_2 and CLKDC_4.

The signal selection unit 410 includes the first to fourth multiplexers 412 to 415. Each of the first and second multiplexers 412 and 413 selects and outputs one of the delay input clocks CLKD_1 to CLKD_N as the first and second coarse delay clocks CLKDC_1 and CLKDC_2 in response to the first coarse delay control signals DLC_1<1:N>. Herein, the first and second multiplexers 412 and 413 are responsive to the first coarse delay control signals DLC_1<1:N> enabling the delay units that generate the delay input clocks inputted to the first and second multiplexers 412 and 413. Each of the third and fourth multiplexers 414 and 415 selects and outputs one of the delay input clocks CLKD_L to CLKD_N as the third and fourth coarse delay clocks CLKDC_3 and CLKDC_4 in response to the second coarse delay control signals DLC_2<1:N>. Herein, the third and fourth multiplexers 414 and 415 are responsive to the second coarse delay control signals DLC_2<1:N> enabling the delay units that generate the delay input clocks inputted to the third and fourth multiplexers 414 and 415. As described above, the first and second coarse delay control signals DLC_1<1:N> and DLC_2<1:N> have N number of bits, and the signal selection unit 410 outputs the first to fourth coarse delay clocks CLKDC_1 to CLKDC_4 in response to a most significant bit (MSB) of the bits of the activated first and second coarse delay control signals DLC_1<1:N> and DLC_2<1:N>.

Therefore, the first to fourth coarse delay clocks CLKDC_1 to CLKDC_4 are delayed by the coarse delay amount COARSE_DD. A difference between the first coarse delay clocks CLKDC_1 and the second coarse delay clock CLKDC_2 corresponds to the unit delay amount UNIT_DD and a difference between the third coarse delay clocks CLKDC_3 and the fourth coarse delay clock CLKDC_4 also corresponds to the unit delay amount UNIT_DD.

To facilitate the understanding, the procedure of activating the first and second coarse delay control signals DLC_1<1:2> and DLC_2<1:3> will exemplarily described below. Specific operation of the signal selection unit 410 will be described in detail with reference to FIGS. 6 and 7.

The delay unit 403 is enabled in response to the first and second coarse delay control signals DLC_1<1> and DLC_2<1> activated at an initial operation of a DLL circuit. Therefore, the delay input clock CLKD_1 is transferred to the first and third multiplexers 412 and 414 through the path ① and the path ②. The first multiplexer 412 selects and outputs the delay input clock CLKD_1 as the first coarse delay clock CLKDC_1 when the first coarse delay control signal DLC_1<1> is activated. Likewise, the third multiplexer 414 selects and outputs the delay input clock CLKD_1 as the third coarse delay clock CLKDC_3 when the second coarse delay control signal DLC_2<1> is activated.

The delay unit 404 is enabled in response to the successively activated first and second coarse delay control signals DLC_1<2> and DLC_2<2>. Therefore, the delay input clock CLKD_2 is transferred to the second and fourth multiplexers 413 and 415 through the path ③ and the path ④. The second and fourth multiplexers 413 and 415 selects and outputs the delay input clock CLKD_2 as the second and fourth coarse delay clocks CLKDC_2 and CLKDC_4 in response to the activated first and second coarse delay control signals DLC_1<2> and DLC_2<2>.

The second coarse delay control signal DLC_2<3> is then activated, and the delay unit 405 is enabled in response to the second coarse delay control signal DLC_2<3>. Therefore, the delay clock CLKD_3 is transferred to the first and third multiplexers 412 and 414 through the path ⑤ and the path ⑥. Also, the delay input clock CLKD_L is transferred to the first and third multiplexers 412 and 414 through the path ① and the path ②. However, only the third multiplexer 414 selects and outputs the delay input clock CLKD_3 as the third coarse delay clock CLKDC_3 in response to the activated second coarse delay control signal DLC_2<3>.

That is, in the DLL circuit, the delay circuit in accordance with the present invention can generate the plurality of coarse delay clocks CLLDC_1 to CLKDC_4 that are delayed by the coarse delay amount COARSE_DD.

The symbol of circlet given to output terminals of the third and fourth multiplexers 414 and 415 in FIG. 5 means 'inversion' of an input signal. The reason for inversion is to correct duty cycle ratios of the first and second delay-locked internal clocks CLK_1 and CLK_2.

Consequently, the delay circuit in accordance with the present invention can generate a plurality of delay clocks and select a desired one of the plurality of delay clocks using only the single delay line unit. Furthermore, the delay circuit in accordance with the present invention can reduce a layout area and power consumption compared to the conventional delay circuit, which will be more fully described with reference to FIG. 6.

Figure 6:
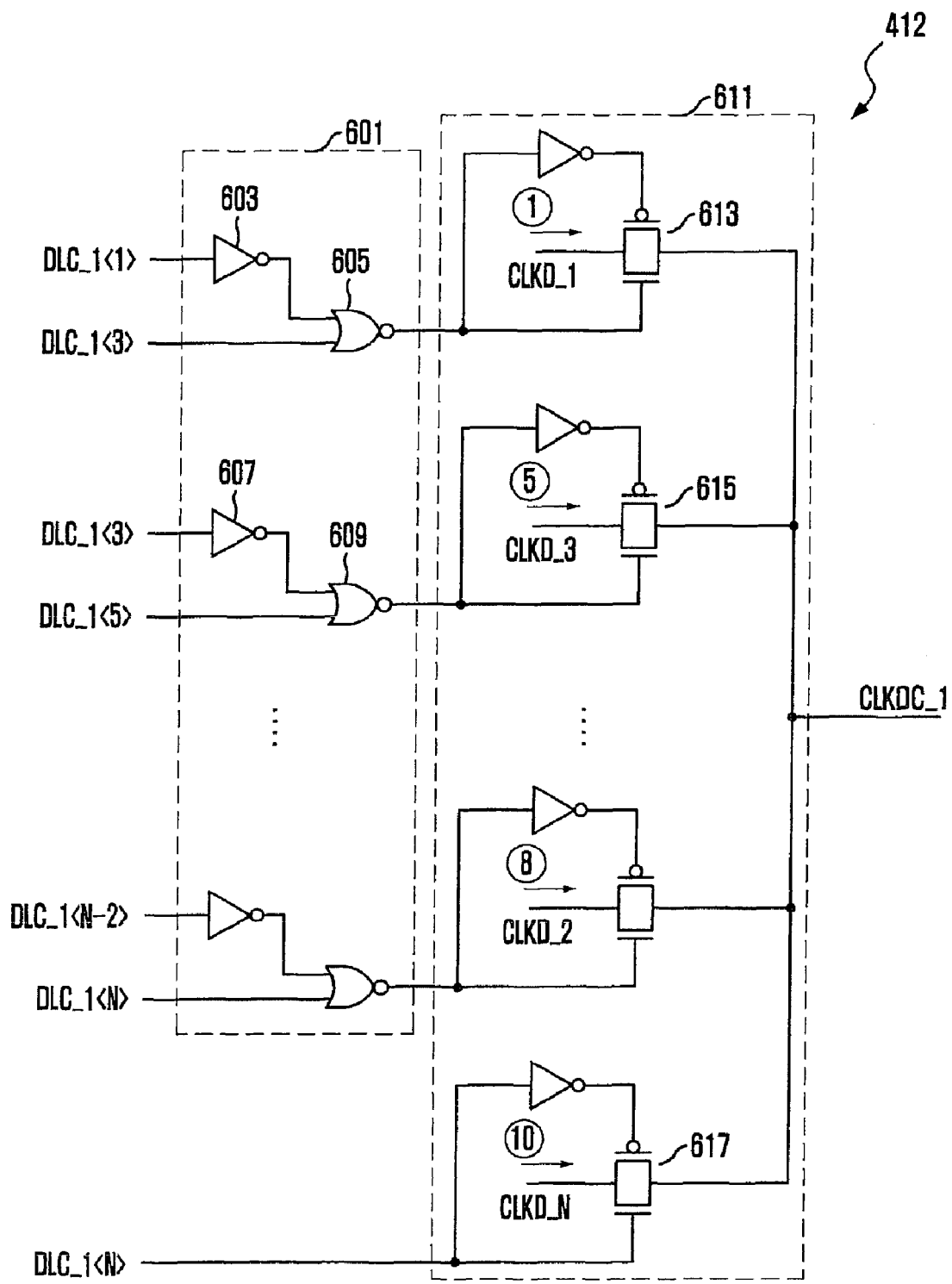
FIG. 6 is a circuit diagram of a first multiplexer shown in FIGS. 4 and 5.

FIG. 6 is a circuit diagram of the first multiplexer (MUX) 412 shown in FIGS. 4 and 5.

The first and third multiplexers 412 and 414 have the same configuration, and thus following description will be focused on the first multiplexer 412.

As illustrated in FIG. 6, the first multiplexer 412 includes a first detection unit 601 and a first selection unit 611. The first detection unit 601 detects the first coarse delay control signals inputted to the first multiplexer 412 to output a signal having a logic high level when a corresponding one of the first coarse delay control signals, i.e., the first coarse delay control signal having an upper bit, is activated.

The first selection unit 611 selects and outputs the delay input clock as the first coarse delay clock CLKDC_1 in response to the signal output from the first detection unit 601. Operation of the first multiplexer 412 will be described in detail below.

When the first coarse delay control signal DLC_1<1> is activated to a logic high level, a first inverter 603 outputs a signal having a logic low level and thus a first NOR gate 605 outputs a signal having a logic high level. Thus, a first pass gate 613 is turned on so that the delay input clock CLKD_1 transferred through the path ① is outputted as the first coarse delay clock CLKDC_1.

Thereafter, when the first coarse delay control signals DLC_1<1:3> are activated to a logic high level, the first NOR gate 605 outputs a signal having a logic low level. As a result, the first pass gate 613 is turned off. However, a second NOR gate 609 outputs a signal having a logic high level because a second inverter 607 outputs a signal having a logic low level. Accordingly, a second pass gate 615 is turned on so that the delay input clock CLKD_3 transferred through the path ⑤ is outputted as the first coarse delay clock CLKDC_1.

When the first coarse delay controls signal DLC_1<1:N> are activated to a logic high level, the delay input clock CLKD_N transferred through the path ⑩ is outputted as the first coarse delay clock CLKDC_1 because only a third pass gate 617 is turned on.

Figure 3:
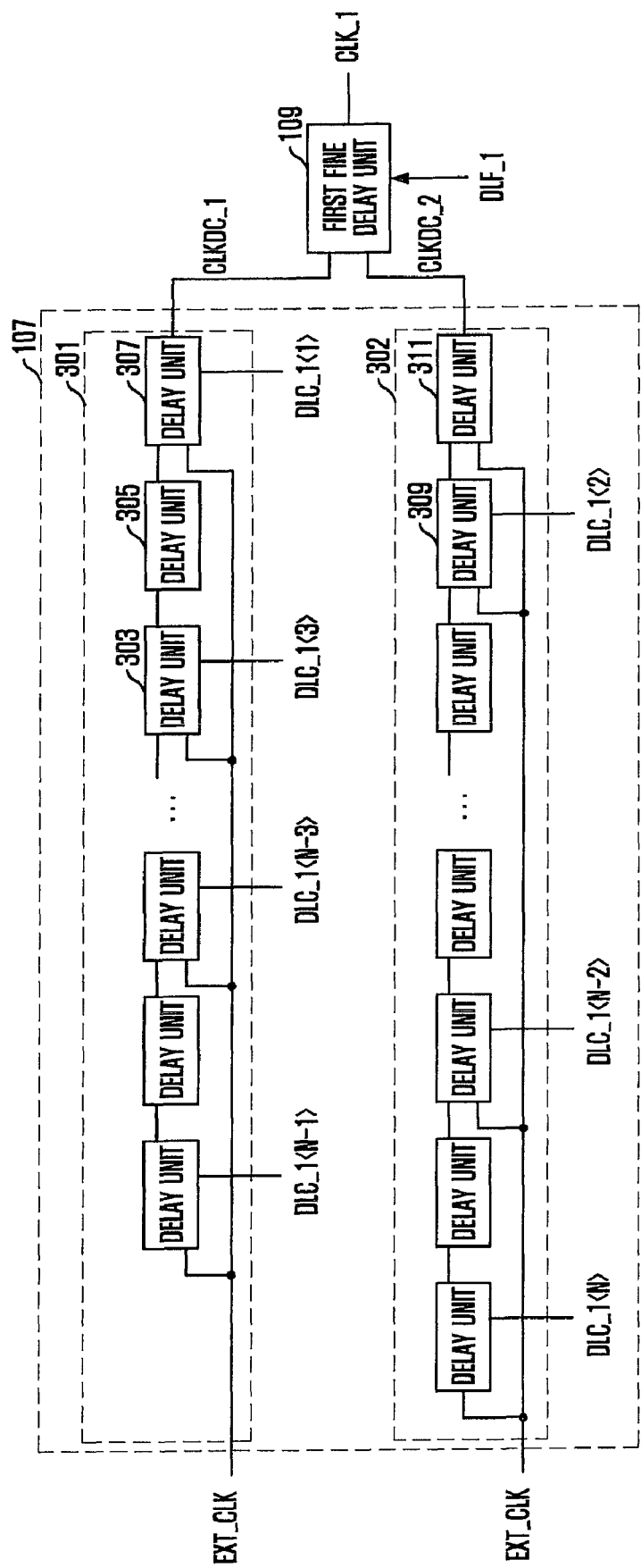
FIG. 3 illustrates a first coarse delay unit and a first fine delay unit shown in FIG. 1.

As illustrated in FIG. 3, four delay lines are required to generate four delay clocks in the conventional DLL circuit, however, the delay circuit in accordance with the present invention includes the single delay line unit 401 and the signal selection unit 410. The delay unit is configured with two NAND gates in general, and a size of the two NAND gates is larger than a total size of an inverter, a NOR gate and a pass gate for selecting and outputting one delay clock. In addition, a total layout area of the single delay line unit 401 and the signal selection unit 410 is smaller than a total layout of the four delay lines because the first to fourth multiplexers 412 to 415 alternatively receive the delay input clocks generated by the delay line unit 401.

Also, when the four delay lines are used, power is consumed in all the delay units of the four delay lines because the clock continues to toggle. However, when the single delay line unit 401 and the signal selection unit 410 are used, power is consumed only in the delay unit enabled in the single delay unit 401. Consequently, the delay circuit in accordance with the present invention consumes power less than the conventional delay circuit.

Figure 7:
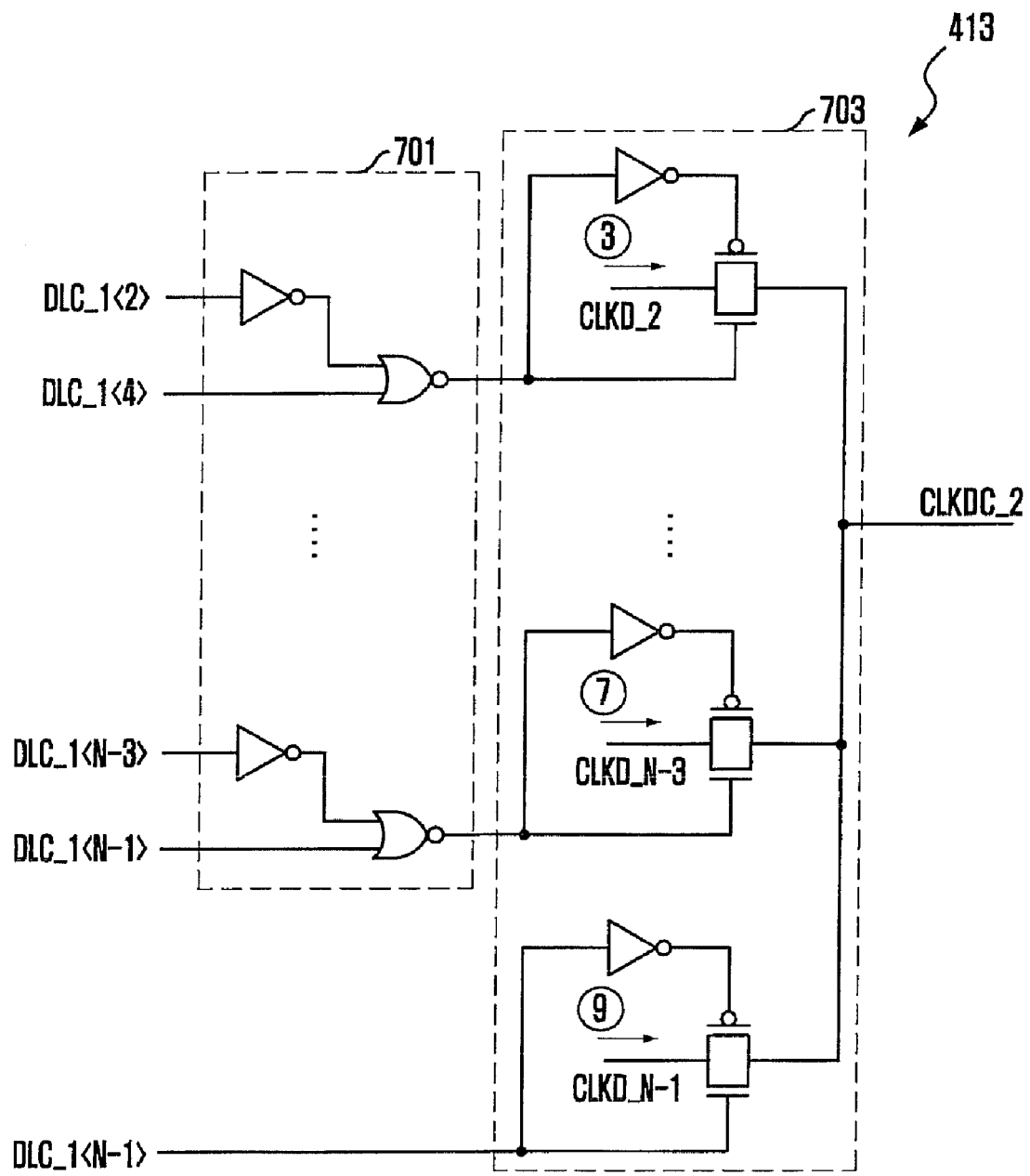
FIG. 7 is a circuit diagram of a second multiplexer shown in FIGS. 4 and 5.

FIG. 7 is a circuit diagram of the second multiplexer 413 in FIGS. 4 and 5.

The second and fourth multiplexers 413 and 415 have the same configuration, and thus following description will be focused on the second multiplexer 413.

The second multiplexer 413 includes a second detection unit 701 and a second comparison unit 703, which are identical in configuration to the first detection unit 601 and the first comparison unit 611 in FIG. 6. However, unlike the first multiplexer 412, the second multiplexer 413 receives the delay input clocks from the delay units 404 and 407, and thus receives the first coarse delay control signal enabling the delay units 404 and 407.

Figure 8:
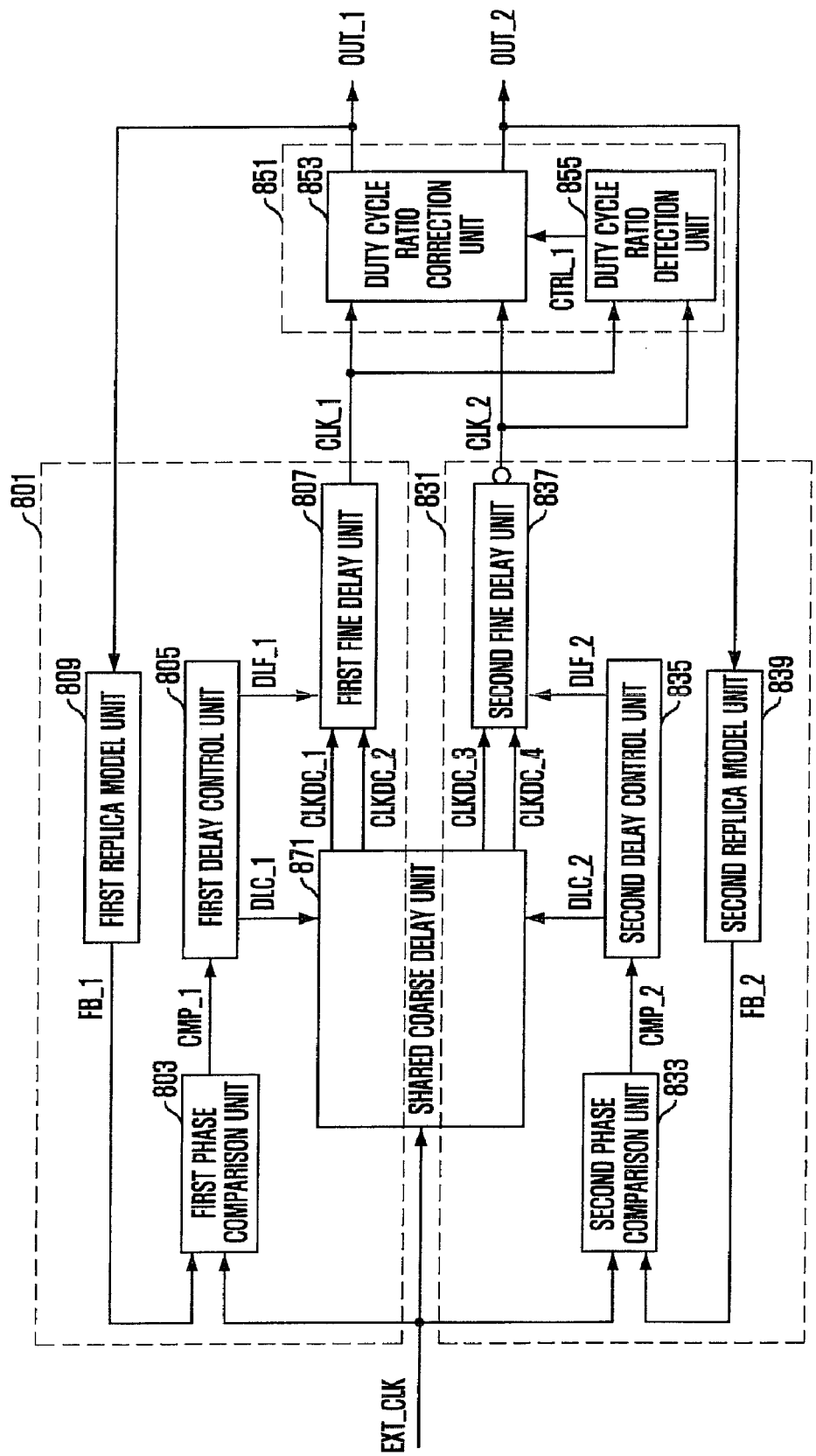
FIG. 8 is a block diagram of a DLL circuit including the delay circuit in accordance with an embodiment of the present invention.

FIG. 8 is a block diagram of a DLL circuit including a delay circuit in accordance with an embodiment of the present invention.

Referring to FIG. 8, the DLL circuit in accordance with this embodiment of the present invention includes a first delay lock circuit 801, a second delay lock circuit 831, a duty cycle ratio correction circuit 851, and a shared coarse delay circuit 871.

The first delay lock circuit 801 includes a first phase comparison unit 803, a first delay control unit 805, a first fine delay unit 807, and a first replica model unit 809. The second delay lock circuit 831 includes a second phase comparison unit 833, a second delay control unit 835, a second fine delay unit 837, and a second replica model unit 839. The first and second delay lock circuits 801 and 831 share the delay circuit in accordance with the present invention as the shared coarse delay circuit 871.

Figure 1:
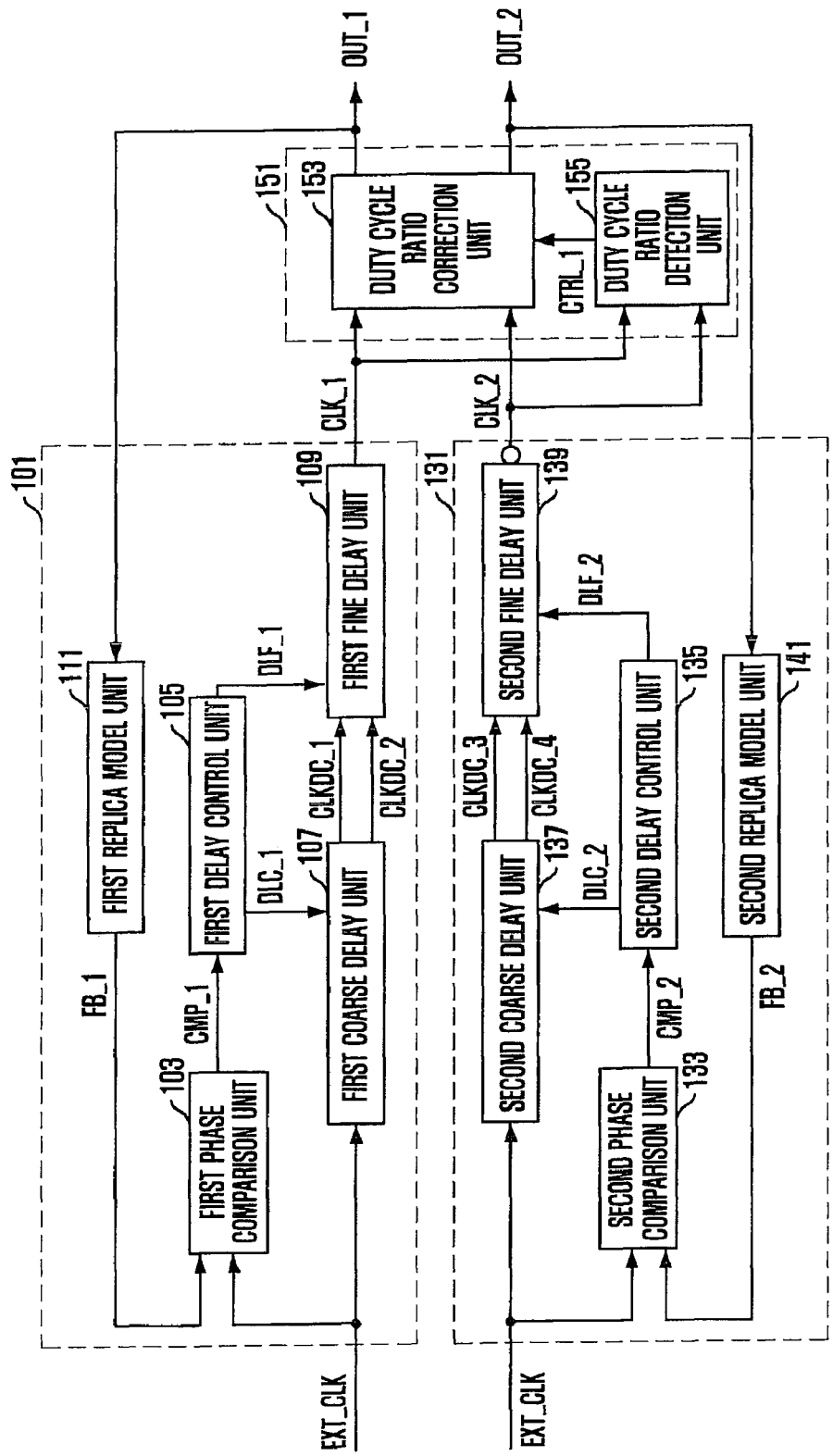
FIG. 1 is a block diagram of a conventional DLL circuit including a duty cycle ratio correction circuit.

Therefore, as described above, the conventional DLL circuit of FIG. 1 includes four delay lines but the DLL circuit in accordance with the present invention includes the delay circuit having one delay line unit, which makes it possible to reduce layout area and power consumption in comparison with the conventional DLL circuit.

The first phase comparison unit 803 compares a phase of an external clock EXT_CLK with that of a first feedback clock FB_1 outputted from the first replica model unit 809 to thereby output a first phase comparison result as a first comparison signal CMP_1. The first delay control unit 805 generates a first coarse delay control signal DLC_1 and a first fine delay control signal DLF_1 in response to the first comparison signal CMP_1.

The shared coarse delay circuit 871 delays the external clock EXT_CLK by a coarse delay amount COARSE_DD to output first and second coarse delay clocks CLKDC_1 and CLKDC_2 in response to the first coarse delay control signal DLC_1. Since the first coarse delay control signal DLC_1 is resulted from the first phase comparison result, the shared coarse delay circuit 871 may also output the first and second coarse delay clocks CLKDC_1 and CLKDC_2 in response to the first phase comparison result. Likewise, the shared coarse delay circuit 871 outputs third and fourth coarse delay clocks CLKDC_3 and CLKDC_4 in response to a second comparison signal CMP_2 as a second phase comparison result of the external clock EXT_CLK and a second feedback clock FB_2, which is outputted from the second delay lock circuit 831.

The first fine delay unit 807 mixes phases of the first and second coarse delay clocks CLKDC_1 and CLKDC_2 to output a first delay-locked internal clock CLK_1 in response to a first fine delay control signal DLF_1.

The second delay lock circuit 831 performs a similar operation to that of the first delay lock circuit 801, and thus outputs a second delay-locked internal clock CLK_2 of which a rising edge is in-phase with a rising edge of the first delay-locked internal clock CLK_1. However, because the second fine delay unit 835 inverts its output signal for the correction of duty cycle ratio, the rising edge of the second delay-locked internal clock CLK_2 is in-phase with the rising edge of the first delay-locked internal clock CLK_1, and the duty cycle ratio of the second delay-locked internal clock CLK_2 is opposite to the duty cycle ratio of the first delay-locked internal clock CLK_1. The symbol of circlet given to an output terminal of the second fine delay unit 835 in FIG. 8 means 'inversion'.

The DLL circuit of FIG. 8 employs the delay circuit of FIG. 5, and therefore the third and fourth multiplexers 414 and 415 of FIG. 5 invert an input signal and then output the inverted signal. When the second fine delay unit 835 inverts and outputs the input signal, the third and fourth multiplexers 414 and 415 do not have to invert and output the input signal. On the contrary, when the third and fourth multiplexers 414 and 415 invert and outputs the input signal, the second fine delay unit 835 does not have to invert and output the input signal.

The duty cycle ratio correction circuit 851 includes a duty cycle ratio correction unit 853 and a duty cycle ratio detection unit 855. The duty cycle ratio detection unit 855 generates a correction signal CTRL_1 containing information about duty cycle ratios of the first and second delay-locked internal clocks CLK_1 and CLK_2 to transfer it to the duty cycle ratio correction unit 853. The duty cycle ratio correction unit 853 corrects the duty cycle ratios of the first and second delay-locked internal clocks CLK_1 and CLK_2 in response to the correction signal CTRL_1.

Figure 9:
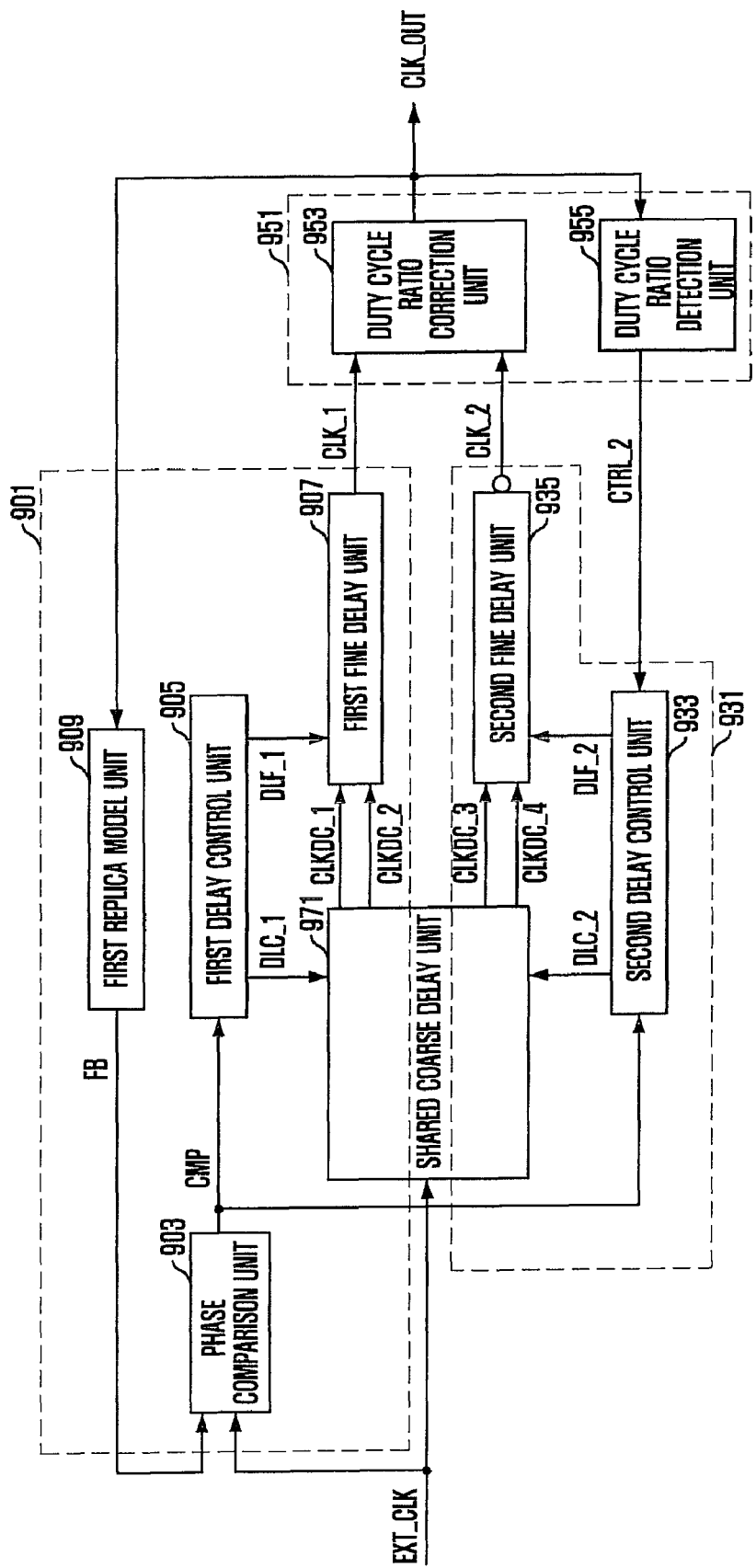
FIG. 9 is a block diagram of a DLL circuit including the delay circuit in accordance with another embodiment of the present invention.

FIG. 9 is a block diagram of a DLL circuit including a delay circuit in accordance with another embodiment of the present invention.

Referring to FIG. 9, the DLL circuit in accordance with this embodiment of the present invention includes a first delay lock circuit 901, a second delay lock circuit 931, a duty cycle ratio correction circuit 951, and a shared coarse delay circuit 971.

The first delay lock circuit 901 includes a phase comparison unit 903, a first delay control unit 905, a first fine delay unit 907, and a replica model unit 909. The second delay lock circuit 931 includes a second delay control unit 933, a second fine delay unit 935. The first and second delay lock circuits 901 and 931 share the delay circuit of the present invention as the shared coarse delay circuit 971.

Therefore, as described above, while the conventional DLL circuit of FIG. 2 includes four delay lines, the DLL circuit in accordance with the present invention includes the delay circuit having one delay line unit, which makes it possible to reduce layout area and power consumption in comparison with the conventional DLL circuit.

The first delay lock circuit 901 is similar in operation and configuration to the first delay lock circuit 801 of FIG. 8. However, the second delay lock circuit 931 does not include the phase comparison unit and the replica model unit, which differs from the second delay unit 831 of FIG. 8. Instead, the second delay lock unit 931 delays an external clock EXT_CLK in response to a comparison signal CMP and a correction signal CTRL_2 generated by a duty cycle ratio detection unit 955 to thereby generate a second delay-locked internal clock CLK_2. This allows the duty cycle ratio correction circuit 951 to correct the duty cycle ratios of the first and second delay-locked internal clocks CLK_1 and CLK_2.

The second delay lock circuit 931 delays the external clock EXT_CLK by a coarse delay amount COARSE_DD and a fine delay amount FINE_DD in response to the comparison signal CMP and the correction signal CTRL_2, and thereafter inverts the delayed external clock to output the second delay-locked internal clock CLK_2.

The shared coarse delay circuit 971 delays the external clock EXT_CLK by the coarse delay amount COARSE_DD to output first and second coarse delay clocks CLKDC_1 and CLKDC_2 in response to the first coarse delay control signal DLC_1. The first coarse delay control signal DLC_1 is resulted from the phase comparison result of the external clock EXT_CLK and the feedback clock FB. Also, the shared coarse delay circuit 971 outputs the third and fourth coarse delay clocks CLKDC_3 and CLKDC_4 in response to the second coarse delay control signal DLC_2. The second coarse delay control signal DLC_2 is outputted in response to the correction signal CTRL_2 which is outputted as the detection result of the duty cycle ratios of the first and second delay-locked internal clocks CLK_1 and CLK_2 by the duty cycle ratio detection unit 955.

Accordingly, the shared coarse delay circuit 971 may also output the first to fourth coarse delay clocks CLKDC_1 to CLKDC_4 in response to the phase comparison result and the duty cycle ratio detection result.

The duty cycle ratio correction circuit 951 detects the duty cycle ration of the correction clock CLK_OUT to generate the correction signal CTRL_2 and correct duty cycle ratios of the first and second delay-locked internal clocks CLK_1 and CLK_2. The duty cycle ratio detection unit 955 generates the correction signal CTRL_2 containing information about the duty cycle ratios of the first and second delay-locked internal clocks CLK_1 and CLK_2 to transfer it to the second delay control unit 933. The second delay control unit 933 controls a delay amount of the second delay-locked internal clock CLK_2 in response to the correction signal CTRL_2. The duty cycle ratio correction unit 953 receives the first and second delay-locked internal clocks CLK_1 and CLK_2 to generate the correction clock CLK_OUT of which the duty cycle ratio is corrected.

Figure 2:
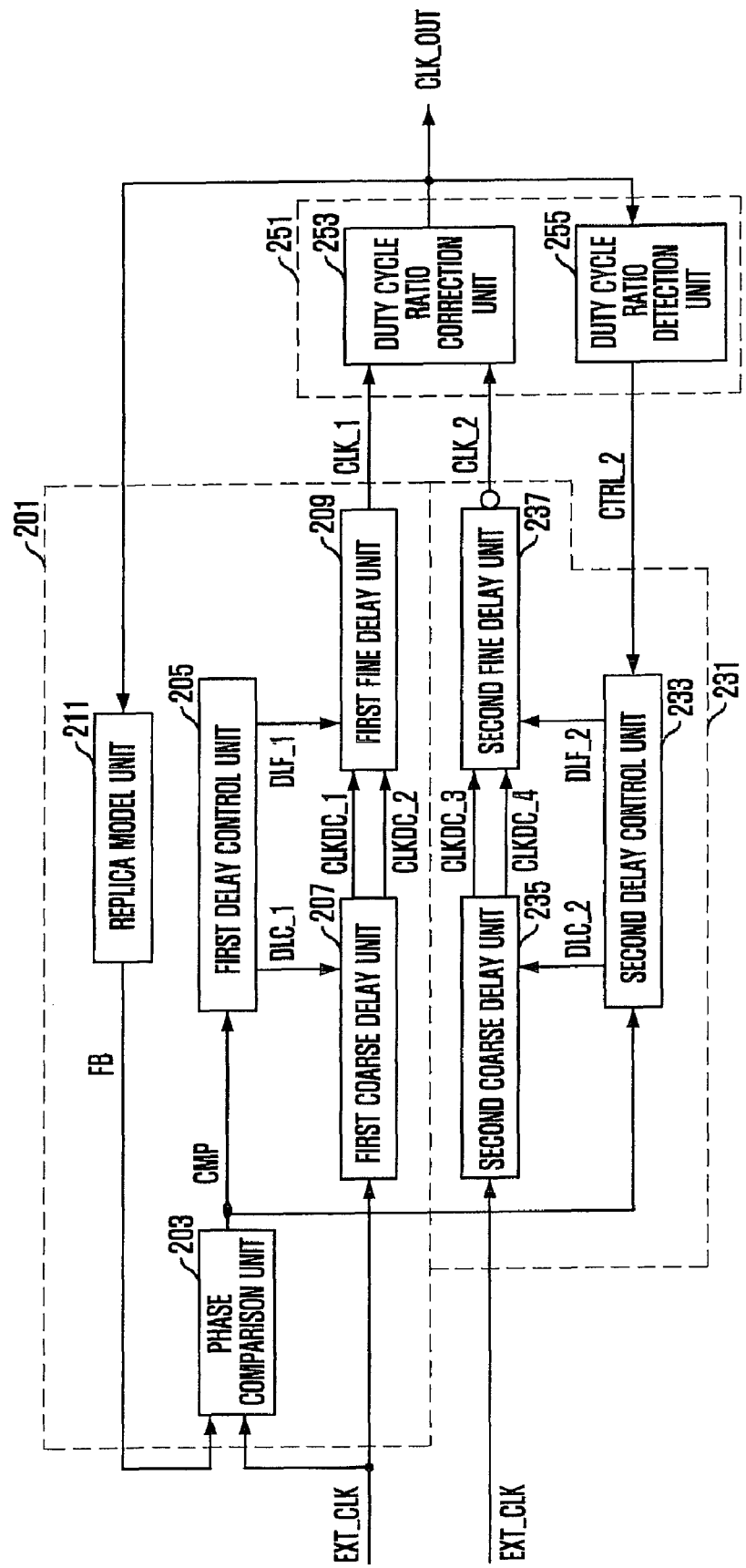
FIG. 2 is a block diagram illustrating another conventional DLL circuit including a duty cycle ratio correction circuit.

As illustrated in FIG. 2, the symbol of circlet given to an output terminal of the second fine delay unit 935 in FIG. 9 means 'inversion'. The DLL circuit of FIG. 9 employs the delay circuit of FIG. 5, and the third and fourth multiplexers 414 and 415 of FIG. 5 invert and output an input signal. When the second fine delay unit 935 inverts and outputs the input signal, the third and fourth multiplexers 414 and 415 do not have to invert and output the input signal. On the contrary, when the third and fourth multiplexers 414 and 415 invert and output the input signal, the second fine delay unit 935 does not have to invert and output the input signal.

Figure 10:
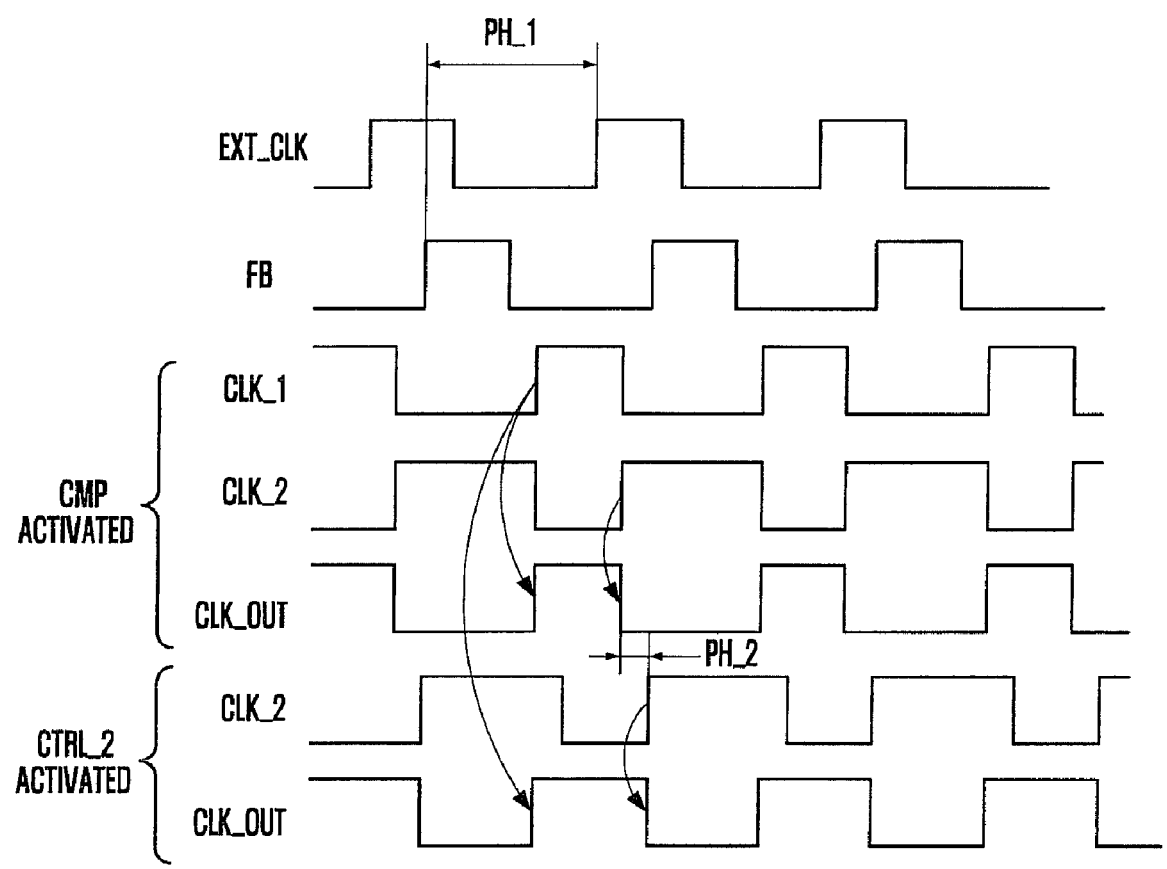
FIG. 10 is a timing diagram illustrating an operation of the DLL circuit of FIG. 9.

FIG. 10 is a timing diagram illustrating an operation of the DLL circuit of FIG. 9.

The phase comparison unit 903 compares a phase of the feedback clock FB with that of the external clock EXT_CLK. Since there is a phase difference between the external clock EXT_CLK and the feedback clock FB, the comparison signal CMP is activated. The shared coarse delay circuit 971 and the first and second fine delay units 907 and 935 delay the external clock EXT_CLK by a first delay amount PH_1 to output the first and second delay-locked internal clocks CLK_1 and CLK_2. The second fine delay unit 935 inverts the input signal, and thus the second delay-locked internal clock CLK_2 is an inverted clock of the first delay-locked internal clock CLK_1.

The duty cycle ratios of the first and second delay-locked internal clocks CLK_1 and CLK_2 are not 50:50 because a logic high level section of the external clock EXT_CLK is narrower than a logic low level section. Since the duty cycle ratio correction circuit 953 detects the rising edges of the firs and second delay-locked internal clocks CLK_1 and CLK_2 to generate the correction clock CLK_OUT having a logic high level section that corresponds to an interval between the rising edge of the first delay-locked internal clock CLK_1 and the rising edge of the second delay-locked internal clock CLK_2, the duty cycle ratio of the correction clock CLK_OUT is not 50:50, either. Therefore, the duty cycle ratio detection unit 955 outputs the activated correction signal CTRL_2 to the second delay control unit 933.

The second delay control unit 933 activates the second coarse delay control signal DLC_2 and the second fine delay control signal DLF_2 in response to the correction signal CTRL_2. The shared coarse delay circuit 971 and the second fine delay unit 935 further delay the external clock EXT_CLK by a second delay amount PH_2 to output the second delay-locked internal clock CLK_2.

The high level section of the correction clock CLK_OUT is wider than the high level section of the external clock EXT_CLK because the second delay-locked internal clock CLK_2 is further delayed by the second delay amount PH_2. Consequently, the duty cycle ratios of the first and second delay-locked internal clocks CLK_1 and CLK_2 are corrected.

In a delay circuit and a DLL circuit including the same in accordance with the present invention, it is possible to reduce layout area and power consumption by generating a plurality of delay clocks using one delay line instead of a plurality of delay lines.

While the present invention has been described with respect to the specific embodiments, it will be apparent to those skilled in the art that various changes and modifications may be made without departing from the spirit and scope of the invention as defined in the following claims.

What is claimed is:

1. A delay circuit, comprising:
    a delay line unit including a plurality of delay units configured to generate a plurality of delay input clocks by delaying an input clock by a unit delay amount in response to at least one delay control signal;
    a signal selection unit configured to selectively output at least one of the plurality of delay input clocks; and an input unit including a plurality of logic gates configured to perform a logic OR operation on the at least one delay control signal and to transfer a resultant signal to the delay line unit.

2. The delay circuit of claim 1, wherein the delay circuit includes a coarse delay circuit within a delay locked loop (DLL) circuit.

3. The delay circuit of claim 2, wherein the at least one delay control signal includes first and second coarse delay control signals.

4. The delay circuit of claim 1, wherein the signal selection unit includes:
a first multiplexer configured to select and output one of the plurality of delay input clocks as a first coarse delay clock in response to the first delay control signal;
a second multiplexer configured to select and output one of the plurality of delay input clocks as a second coarse delay clock in response to the first coarse delay control signal;
a third multiplexer configured to select and output one of the plurality of delay input clocks as a third coarse delay clock in response to the second coarse delay control signal; and
a fourth multiplexer configured to select and output one of the plurality of delay input clocks as a fourth coarse delay clock in response to the second coarse delay control signal.

5. The delay circuit of claim 4, wherein the first and second multiplexers alternatively receive the delay input clocks having a difference in delay time therebetween that corresponds to the unit delay amount.

6. The delay circuit of claim 4, wherein the third and fourth multiplexers alternatively receive the delay input clocks having a difference in delay time therebetween that corresponds to the unit delay amount.

7. A delay locked loop (DLL) circuit, comprising:
a shared coarse delay circuit configured to delay an external clock by a coarse delay amount to output first to fourth coarse delay clocks in response to first and second coarse delay control signals;
a first delay lock circuit configured to mix phases of the first and second coarse delay clocks to output a first internal clock in response to a first fine delay control signal;
a second delay lock circuit configured to mix phases of the third and fourth coarse delay clocks to output a second internal clock in response to a second fine delay control signal; and
a duty cycle ratio correction circuit configured to correct duty cycle ratios of the first and second internal clocks,
wherein the shared coarse delay circuit includes an input unit including a plurality of logic gates configured to perform a logic OR operation on the first and second coarse delay control signals.

8. The DLL circuit of claim 7, wherein the first delay lock circuit generates the first coarse delay control signal by comparing the external clock with a first feedback clock in which a delay modeling of the external clock is applied.

9. The DLL circuit of claim 8, wherein the second delay lock circuit generates the second coarse delay control signal by comparing the external clock with a second feedback clock in which the delay modeling of the external clock is applied.

10. The DLL circuit of claim 7, wherein the first delay lock circuit includes:
a first phase comparison unit configured to compare phases of the external clock and a first feedback clock to generate a first comparison signal;
a first delay control unit configured to generate the first coarse delay control signal and the first fine delay control signal in response to the first comparison signal;
a first fine delay unit configured to mix phases of the first and second coarse delay clocks to output the first internal clock in response to the first fine delay control signal; and
a first replica model unit configured to receive the first internal clock to output the first feedback clock.

11. The DLL circuit of claim 10, wherein the second delay lock circuit includes:
a second phase comparison unit configured to compare phases of the external clock and a second feedback clock to generate a second comparison signal;
a second delay control unit configured to generate the second coarse delay control signal and the second fine delay control signal in response to the second comparison signal;
a second fine delay unit configured to mix and invert phases of the third and fourth coarse delay clocks to output the second internal clock in response to the second fine delay control signal; and
a second replica model unit configured to receive the second internal clock to output the second feedback clock.

12. The DLL circuit of claim 7, wherein the shared coarse delay circuit further comprises:
a delay line unit including a plurality of delay units configured to delay the external clock by a unit delay amount to generate a plurality of delay input clocks corresponding to the first and second coarse delay control signals in response to an output signal of the input unit; and
a signal selection unit configured to selectively output the delay input clocks as the first to fourth coarse delay clocks in response to the first and second coarse delay control signals.

13. The DLL circuit of claim 12, wherein the unit delay amount is smaller than the coarse delay amount.

14. The DLL circuit of claim 12, wherein the signal selection unit includes:
a first multiplexer configured to output the first coarse delay clock in response to the first coarse delay control signal;
a second multiplexer configured to output the second coarse delay clock in response to the first coarse delay control signal;
a third multiplexer configured to output the third coarse delay clock in response to the second coarse delay control signal; and
a fourth multiplexer configured to output the fourth coarse delay clock in response to the second coarse delay control signal.

15. The DLL circuit of claim 14, wherein the first and second multiplexers alternatively receive the delay input clocks having a difference in delay time therebetween that corresponds to the unit delay amount.

16. The DLL circuit of claim 14, wherein the third and fourth multiplexers alternatively receive the delay input clocks having a difference in delay time therebetween that corresponds to the unit delay amount.

17. A delay locked loop (DLL) circuit, comprising:
a shared coarse delay circuit configured to delay an external clock by a coarse delay amount to output first to fourth coarse delay clocks in response to a phase comparison result and a duty cycle ratio detection result;
a first delay lock circuit configured to mix phases of the first and second coarse delay clocks to output a first internal clock in response to the phase comparison result of the external clock and a feedback clock in which a delay modeling of the external clock is applied;

a second delay lock circuit configured to mix phases of the third and fourth coarse delay clocks to output a second internal clock in response to the phase comparison result and the duty cycle ratio detection result; and a duty cycle ratio correction circuit configured to generate a correction signal as the duty cycle ratio detection result of the first and second internal clocks, and correct duty cycle ratios of the first and second internal clocks, wherein the shared coarse delay circuit includes an input unit including a plurality of logic gates configured to perform a logic OR operation on first and second coarse delay control signals.

18. The delay circuit of claim 17, wherein the first delay lock circuit includes:

a phase comparison unit configured to compare phases of the external clock and the feedback clock to generate a comparison signal;

a first delay control unit configured to generate the first coarse delay control signal and a first fine delay control signal in response to the comparison signal;

a first fine delay unit configured to mix phases of the first and second coarse delay clocks to output the first internal clock in response to the first fine delay control signal; and a first replica model unit configured to receive the first internal clock to output the feedback clock.

19. The delay circuit of claim 18, wherein the second delay lock circuit includes:

a second delay control unit configured to generate the second coarse delay control signal and a second fine delay control signal in response to the comparison signal and the correction signal; and a second fine delay unit configured to mix and invert phases of the third and fourth coarse delay clocks to output the second internal clock in response to the second fine delay control signal.

20. The delay circuit of claim 19, wherein the shared coarse delay circuit further comprises:

a delay line unit including a plurality of delay units configured to delay the external clock by a unit delay amount to generate a plurality of delay input clocks corresponding to the first and second coarse delay control signals in response to an output signal of the input unit; and a signal selection unit configured to selectively output the delay input clocks as the first to fourth coarse delay clocks in response to the first and second coarse delay control signals.

21. The delay circuit of claim 20, wherein the signal selection unit includes:

a first multiplexer configured to output the first coarse delay clock in response to the first coarse delay control signal;

a second multiplexer configured to output the second coarse delay clock in response to the first coarse delay control signal;

a third multiplexer configured to output the third coarse delay clock in response to the second coarse delay control signal; and a fourth multiplexer configured to output the fourth coarse delay clock in response to the second coarse delay control signal.

22. The delay circuit of claim 21, wherein the first and second multiplexers alternatively receive the delay external clocks having a difference in delay time therebetween that corresponds to the unit delay amount.

23. The delay circuit of claim 21, wherein the third and fourth multiplexers alternatively receive the delay external clocks having a difference in delay time therebetween that corresponds to the unit delay amount.

24. The delay circuit of claim 17, wherein the duty cycle ratio correction circuit defines an interval between a first edge of the first internal clock and a first edge of the second internal clock as a first logic level.

* * * * *